(12) United States Patent
Eto

(10) Patent No.: US 8,334,578 B2
(45) Date of Patent: Dec. 18, 2012

(54) INTEGRATED CIRCUIT HAVING WIRING STRUCTURE, SOLID IMAGE PICKUP ELEMENT HAVING THE WIRING STRUCTURE, AND IMAGING DEVICE HAVING THE SOLID IMAGE PICKUP ELEMENT

(75) Inventor: Takeharu Eto, Minou (JP)

(73) Assignee: Kinki University, Osaka (JP)

( * ) Notice: Subject to any disclaimer, the term of this patent is extended or adjusted under 35 U.S.C. 154(b) by 493 days.

(21) Appl. No.: 12/658,593

(22) Filed: Feb. 10, 2010

(65) Prior Publication Data

US 2010/0244176 A1    Sep. 30, 2010

Related U.S. Application Data

(63) Continuation-in-part of application No. PCT/JP2008/059059, filed on May 16, 2008.

(30) Foreign Application Priority Data

Aug. 17, 2007    (JP) .................................. 2007-213097

(51) Int. Cl.
*H01L 31/00* (2006.01)
(52) U.S. Cl. ................. 257/459; 257/460; 257/E23.141
(58) Field of Classification Search ................. 257/459, 257/460
See application file for complete search history.

(56) References Cited

U.S. PATENT DOCUMENTS 5,373,114 A * 12/1994 Kondo et al. ................. 174/268

FOREIGN PATENT DOCUMENTS

JP    06-291428    10/1994

(Continued)

OTHER PUBLICATIONS

PCT Application No. PCT/JP2008/059059, International Search Report and Written Opinion dated Aug. 26, 2008.

(Continued)

*Primary Examiner* — Thien F Tran
(74) *Attorney, Agent, or Firm* — Larry E. Henneman, Jr.; Henneman & Associates, PLC

(57) ABSTRACT

(Problems)
To provide an integrated circuit having the wiring structure including pads with a small wiring area and capable of highly integrating elements, a solid image pickup element having the wiring structure, and an imaging device having the solid image pickup element.
(Means for Solving Problems)
An integrated circuit comprising at least two elements, each element having a wiring structure, the wiring structure comprising:
  a plurality of wirings aligned in parallel on a plane, each wiring comprising:
    a plurality of pads aligned at a substantially constant interval in a left and right direction; and
    a plurality of conductive wires for connecting adjacent pads, the conductive wires having a narrower width than the pads, two conductive wires being extended from one pad in a parallel and opposite direction, one of the two conductive wires having an upper side disposed in a same straight line as an uppermost end of the one pad and the other conductive wire having a lower side disposed in a same straight line as a lowermost end of the one pad, and a gravity center line connecting centers of gravity of all the pads in the wiring and being a straight line not parallel to an extension direction of the conductive wires; and
  wherein a plurality of the gravity center lines in the plurality of wirings are parallel to each other,
  adjacent wirings of the plurality of wirings are spaced more than a minimum wiring spacing, and
  a pad of the wiring structure of the one element and a pad of the wiring structure of the other element are connected to each other.

16 Claims, 12 Drawing Sheets

FOREIGN PATENT DOCUMENTS

| JP | 06-333968 | 12/1994 |
| JP | 2002-299595 | 10/2002 |
| JP | 2006-049361 | 2/2006 |

OTHER PUBLICATIONS

PCT Application No. PCT/JP2008/059059, International Preliminary Report on Patentability dated Mar. 9, 2010.

* cited by examiner

Fig. 7
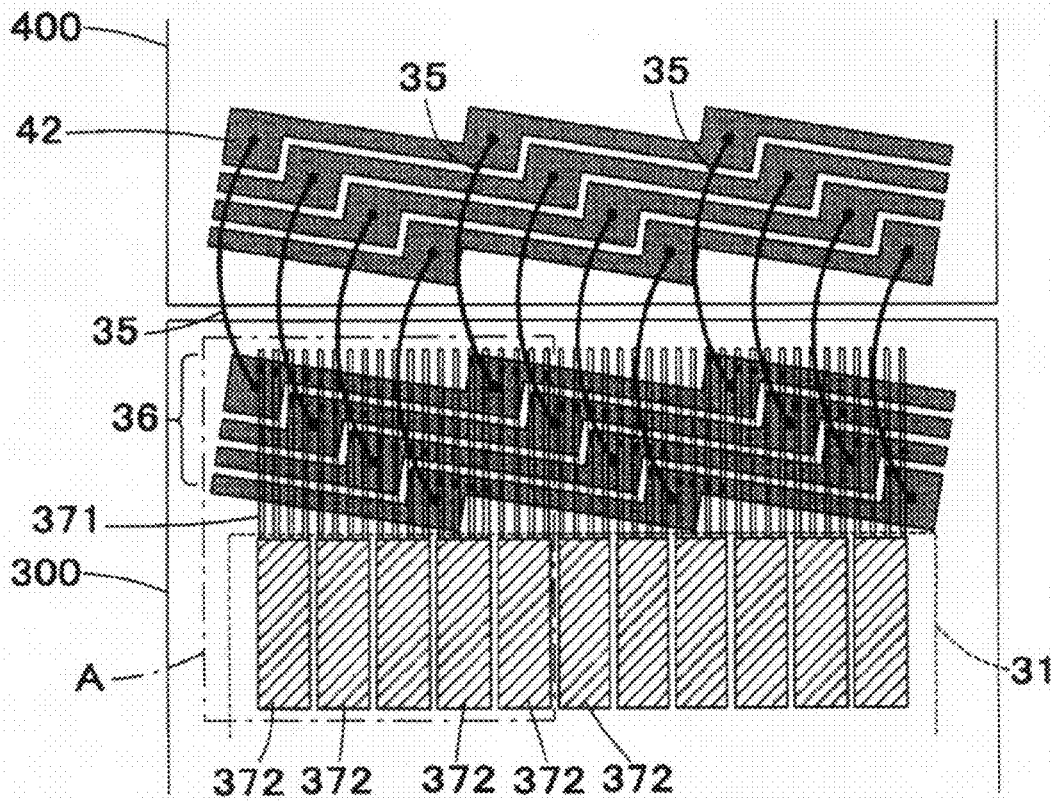
(a)
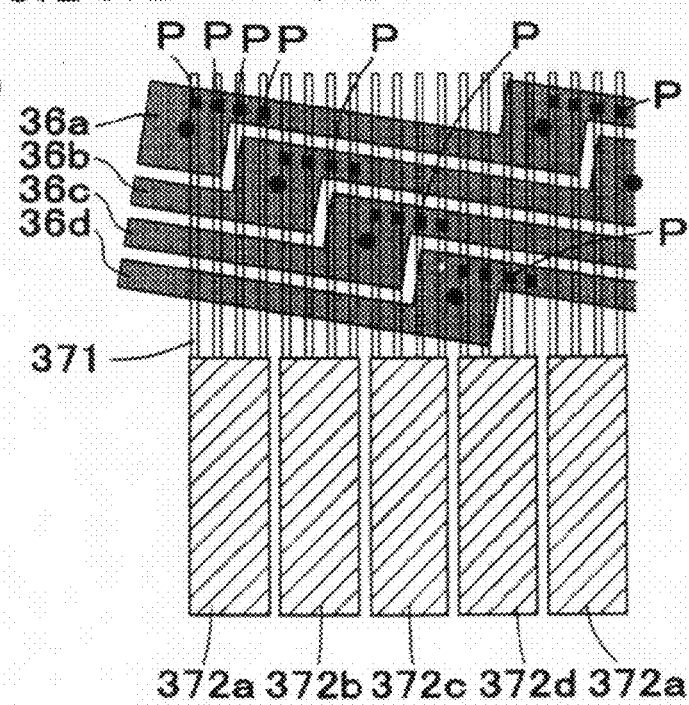
(b)

Fig.10
(a)
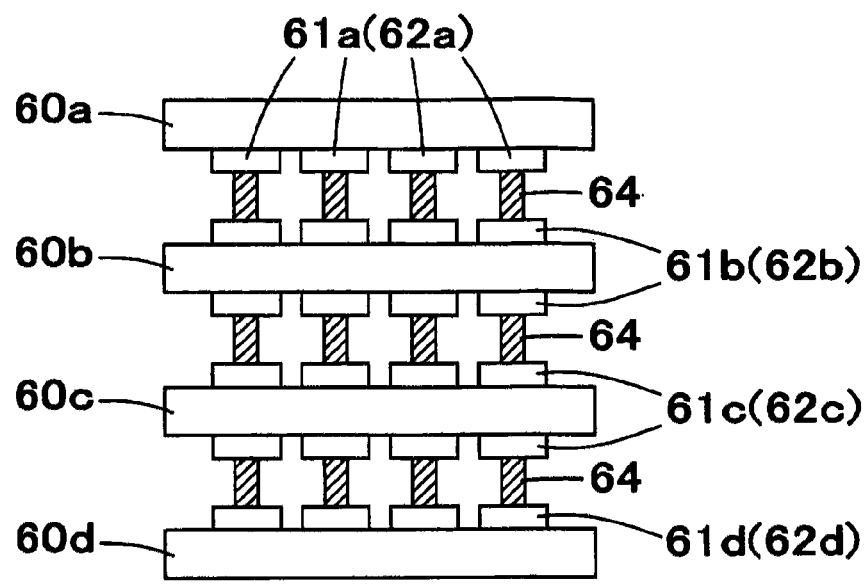
(b)
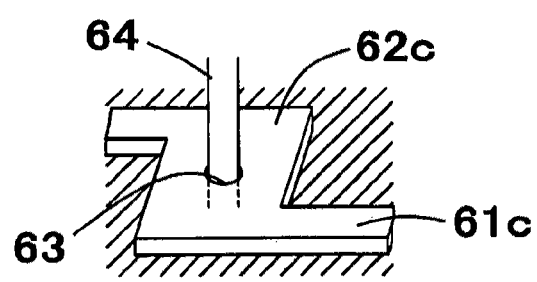

Fig.11
(a)
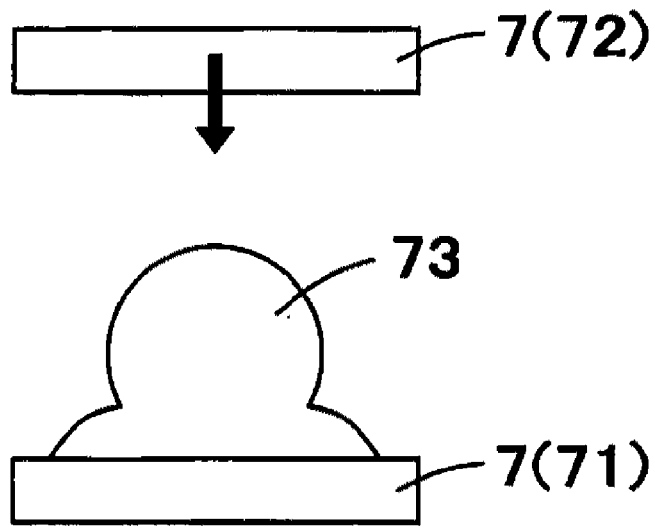
(b)
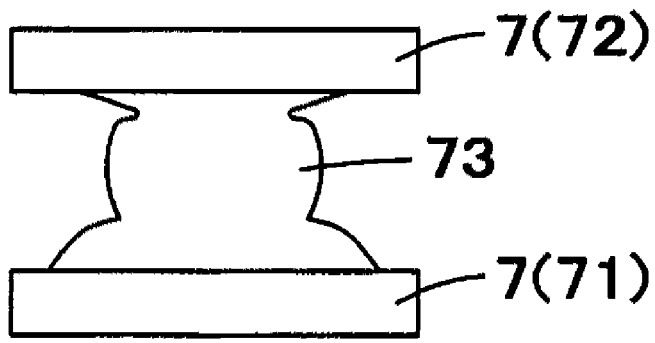

INTEGRATED CIRCUIT HAVING WIRING STRUCTURE, SOLID IMAGE PICKUP ELEMENT HAVING THE WIRING STRUCTURE, AND IMAGING DEVICE HAVING THE SOLID IMAGE PICKUP ELEMENT

CROSS REFERENCE TO RELATED APPLICATION

This application is a continuation-in-part of PCT/JP2008/059059 (filed on May 16, 2008 by at least one common inventor), which claims priority of Japanese Application No. 2007-213097 (filed on Aug. 17, 2007 by at least one common inventor), and both prior applications are incorporated herein by reference in their entireties.

FIELD OF THE INVENTION

This invention relates to an integrated circuit having a wiring structure including pads connected to an outer element, a solid image pickup element having the wiring structure, and an imaging device having the solid image pickup element.

DESCRIPTION OF THE RELATED ART

Recently, techniques for making highly-functional integrated circuits by connecting integrated circuit chips and elements have been developed.

For such the techniques, for example, a solid image pickup element provided with an image transfer circuit and a drive circuit element for the solid image pickup element are independently prepared, and the drive circuit element is connected to the image transfer circuit. Here, a drive signal generated from the drive circuit element is transferred to each pixel in the solid image pickup element.

As a method for connecting the solid image pickup element and the drive circuit element, a use of a connecting wire such as a metal wire is exampled. Further, Tokkai 2002-299595 and Tokkai 2006-49361 also disclose methods for connecting the solid image pickup element and the drive circuit element by means of a fine bump comprising a soft metal such as indium.

In both cases of using the connecting wire and the bump, the connection of the solid image pickup element and the drive circuit element is carried out by connecting a conductive pad in the solid image pickup element with a conductive pad in the drive circuit element.

When the connecting wire is used to connect the pads of the two elements, the connecting wire and the pads are connected by means of soldering and so on. Therefore, a connecting area of the pad (hereinafter referred to as just "area of pad") is not enough when it is the same as a cross-section area of the connecting wire, and it also requires a size including an area to ensure the connection by means of soldering.

Also, the area of pad requires a certain size when the bump is used to connect the pads of the two elements. Hereinafter, the case of connecting the pads of the two elements by means of the bump will be explained by referring to FIG. 11.

FIG. 11 is an illustrative diagram to show a method for connecting a pad (71) of a solid image pickup element and a pad (72) of a drive circuit element by means of a bump (73). FIG. 11 (a) shows a cross-section before the connection, and FIG. 11 (b) shows a cross-section after the connection.

As shown in FIG. 11 (a), a bump (73) is mounted on a pad (71) that is provided on one element (for example, solid image pickup element) and it is connected to the pad (71) by soldering and so on. In order to connect the bump (73) to the pad (71) by soldering, an area of the pad (71) should be decided in consideration of an area for such the connection by soldering.

Also, a pad (72) is provided on a surface of a drive circuit element facing the solid image pickup element. As shown in FIG. 11 (b), the elements are compressed to each other and the bump (73) is squashed up, which permits conduction between the pad (71) of the solid image pickup element and the pad (72) of the drive circuit element.

At this time, the elements are compressed, which results in pressing the bump (73) to be squashed. This leads to enlarge the bump (73) on the pad (7). Therefore, the area of the pad (7) requires a size such that the bump (73) does not stick out from the pad (7) even when the bump (73) is enlarged.

As shown above, in order to connect the elements to each other, the area of the pad requires a certain size in consideration of the connection by soldering and the enlargement of the bump.

On the other hand, conductive wires are used to connect the pads provided within one element.

FIG. 12 shows a wiring structure, wherein wirings (75) comprising pads (7) and conductive wires (74) are aligned in parallel.

The pad (7) is wider than the conductive wire (74) connected to the pad (7) because the area of the pad (7) should be a certain size in consideration of the connection by soldering and the enlargement of the bump as described above. Generally, the width (length of up-and-down direction in FIG. 12) of the pad (7) is several times larger than that of the conductive wire (74).

The wiring structure such as FIG. 12 generates space (76) because the pad (7) is wider than the conductive wire (74). Disadvantageously, the generated space (76) obstructs wiring integration, increases the wiring area and interrupts high integration of elements.

Especially, the number of pixels and the number of drive circuit elements have increased as integrated circuits have become highly-functional in recent years, which leads to increase the number of wirings as well as the number of pads. Therefore, the enlarged wiring area causes problems such as interrupting high integration, which has been an obvious issue.

SUMMARY OF INVENTION

The present invention is to solve the above problems, and to provide an integrated circuit having a wiring structure including pads with a small wiring area and capable of highly integrating elements, a solid image pickup element having the wiring structure, and an imaging device having the solid image pickup element.

One embodiment of the present invention relates to an integrated circuit comprising at least two elements, each element having a wiring structure, the wiring structure comprising: a plurality of wirings aligned in parallel on a plane, each wiring comprising: a plurality of pads aligned at a substantially constant interval in a left and right direction; and a plurality of conductive wires for connecting adjacent pads, the conductive wires having a narrower width than the pads, two conductive wires being extended from one pad in a parallel and opposite direction, one of the two conductive wires having an upper side disposed in a same straight line as an uppermost end of the one pad and the other conductive wire having a lower side disposed in a same straight line as a lowermost end of the one pad, and a gravity center line connecting centers of gravity of all the pads in the wiring and being a straight line not parallel to an extension direction of the conductive wires; and wherein a plurality of the gravity center lines in the plurality of wirings are parallel to each other, adjacent wirings of the plurality of wirings are spaced more than a minimum wiring spacing, and a pad of the wiring structure of the one element and a pad of the wiring structure of the other element are connected to each other.

Another embodiment of the present invention relates to the integrated circuit, wherein the pad is a quadrangle having an upper side and a lower side, one of the two conductive wires extended from the one pad has a lower side disposed in a same straight line as a lower side of the one pad and the other conductive wire has an upper side disposed in a same straight line as an upper side of the one pad.

Yet another embodiment of the present invention relates to the integrated circuit, further comprising a second wiring structure connected to the wiring structure, wherein the second wiring structure comprises a plurality of wirings aligned in parallel or right angle to the gravity center line connecting centers of gravity of all the pads in the wiring of the wiring structure.

Yet another embodiment of the present invention relates to the integrated circuit, wherein the one element and the other element are lapped each other, and the pads of the wiring structures of respective elements are connected to each other by a bump.

Yet another embodiment of the present invention relates to the integrated circuit, wherein a plurality of the elements are lapped each other, and the pads of the wiring structures of respective elements are connected to each other by a pier, the pier configured to pass through the pad.

Yet another embodiment of the present invention relates to a solid image pickup element comprising a busline section having a wiring structure, the busline section being connected to a drive signal output section for outputting a drive signal, the wiring structure comprising: a plurality of wirings aligned in parallel on a plane, each wiring comprising: a plurality of pads aligned at a substantially constant interval in a left and right direction; and a plurality of conductive wires for connecting adjacent pads, the conductive wires having a narrower width than the pads, two conductive wires being extended from one pad in a parallel and opposite direction, one of the two conductive wires having an upper side disposed in a same straight line as an uppermost end of the one pad and the other conductive wire having a lower side disposed in a same straight line as a lowermost end of the one pad, and a gravity center line connecting centers of gravity of all the pads in the wiring and being a straight line not parallel to an extension direction of the conductive wires; and wherein a plurality of the gravity center lines in the plurality of wirings are parallel to each other, and adjacent wirings of the plurality of wirings are spaced more than a minimum wiring spacing.

Yet another embodiment of the present invention relates to the solid image pickup element, wherein the pad is a quadrangle having an upper side and a lower side, one of the two conductive wires extended from the one pad has a lower side disposed in a same straight line as a lower side of the one pad and the other conductive wire has an upper side disposed in a same straight line as an upper side of the one pad.

Yet another embodiment of the present invention relates to the solid image pickup element, further comprising a second wiring structure connected to the wiring structure described above, wherein the second wiring structure comprises a plurality of wirings aligned in parallel or right angle to the gravity center line connecting centers of gravity of all the pads in the wiring of the wiring structure.

Yet another embodiment of the present invention relates to the solid image pickup element, wherein the solid image pickup element is a back-illuminated type and comprises a drive signal transfer line for inputting the drive signal from the busline section into a pixel column, the drive signal transfer line comprising: a plurality of busline section drive signal transfer lines traversing the busline section; and a pixel section drive signal transfer line traversing a pixel section in which pixels are aligned, wherein the pixel drive section signal transfer line is wider than the busline section drive signal transfer line, and the plurality of the busline section drive signal transfer lines are connected to the one pixel section drive signal transfer line.

Yet another embodiment of the present invention relates to an imaging device having the solid image pickup element.

According to one embodiment of the present invention, an integrated circuit comprising at least two elements is disclosed, each element has a wiring structure, and the wiring structure comprises: a plurality of wirings aligned in parallel on a plane, each wiring comprising: a plurality of pads aligned at a substantially constant interval in a left and right direction; and a plurality of conductive wires for connecting adjacent pads, the conductive wires having a narrower width than the pads, two conductive wires being extended from one pad in a parallel and opposite direction, one of the two conductive wires having an upper side disposed in a same straight line as an uppermost end of the one pad and the other conductive wire having a lower side disposed in a same straight line as a lowermost end of the one pad, and a gravity center line connecting centers of gravity of all the pads in the wiring and being a straight line not parallel to an extension direction of the conductive wires; and wherein a plurality of the gravity center lines in the plurality of wirings are parallel to each other, adjacent wirings of the plurality of wirings are spaced more than a minimum wiring spacing, and a pad of the wiring structure of the one element and a pad of the wiring structure of the other element are connected to each other. This enables to decrease a space between the wirings and reduce the wiring area, which allows elements having the wiring structures to be highly integrated. Also, this enables to reduce a mounting area of the integrated circuit even when the integrated circuit has a complex structure.

According to another embodiment of the present invention, the integrated circuit is disclosed, wherein the pad is a quadrangle having an upper side and a lower side, one of the two conductive wires extended from the one pad has a lower side disposed in a same straight line as a lower side of the one pad and the other conductive wire has an upper side disposed in a same straight line as an upper side of the one pad. This enables to easily decrease a space between the wirings, which leads to reduce the wiring area.

According to yet another embodiment of the present invention, the integrated circuit further comprising a second wiring structure connected to the wiring structure described is disclosed, wherein the second wiring structure comprises a plurality of wirings aligned in parallel or right angle to the gravity center line connecting centers of gravity of all the pads in the wiring of the wiring structure. This enables to form an element with a complex structure.

According to yet another embodiment of the present invention, the integrated circuit is disclosed, wherein the one element and the other element are lapped each other, and the pads of the wiring structures of respective elements are connected to each other by a bump. This enables to further reduce a mounting area of the integrated circuit since elements are not aligned on the same plane.

According to yet another embodiment of the present invention, the integrated circuit is disclosed, wherein a plurality of the elements are lapped each other, and the pads of the wiring structures of respective elements are connected to each other by a pier, the pier configured to pass through the pad. This enables to lap and connect a plurality of elements and further reduce a mounting area of the integrated circuit.

According to yet another embodiment of the present invention, a solid image pickup element comprising a busline section having a wiring structure, the busline section being connected to a drive signal output section for outputting a drive signal is disclosed, and the wiring structure comprises: a plurality of wirings aligned in parallel on a plane, each wiring comprising: a plurality of pads aligned at a substantially constant interval in a left and right direction; and a plurality of conductive wires for connecting adjacent pads, the conductive wires having a narrower width than the pads, two conductive wires being extended from one pad in a parallel and opposite direction, one of the two conductive wires having an upper side disposed in a same straight line as an uppermost end of the one pad and the other conductive wire having a lower side disposed in a same straight line as a lowermost end of the one pad, and a gravity center line connecting centers of gravity of all the pads in the wiring and being a straight line not parallel to an extension direction of the conductive wires; and wherein a plurality of the gravity center lines in the plurality of wirings are parallel to each other, and adjacent wirings of the plurality of wirings are spaced more than a minimum wiring spacing. This enables to reduce an area of the solid image pickup element.

According to yet another embodiment of the present invention, the solid image pickup element is disclosed, wherein the pad is a quadrangle having an upper side and a lower side, one of the two conductive wires extended from the one pad has a lower side disposed in a same straight line as a lower side of the one pad and the other conductive wire has an upper side disposed in a same straight line as an upper side of the one pad. This enables to reduce an area of the solid image pickup element.

According to yet another embodiment of the present invention, the solid image pickup element is disclosed, further comprising a second wiring structure connected to the wiring structure described above, wherein the second wiring structure comprises a plurality of wirings aligned in parallel or right angle to the gravity center line connecting centers of gravity of all the pads in the wiring of the wiring structure. This enables to reduce an area of the solid image pickup element.

According to yet another embodiment of the present invention, the solid image pickup element is disclosed, wherein the solid image pickup element is a back-illuminated type and comprises a drive signal transfer line for inputting the drive signal from the busline section into a pixel column, the drive signal transfer line comprising: a plurality of busline section drive signal transfer lines traversing the busline section; and a pixel section drive signal transfer line traversing a pixel section in which pixels are aligned, wherein the pixel drive section signal transfer line is wider than the busline section drive signal transfer line, and the plurality of the busline section drive signal transfer lines are connected to the one pixel section drive signal transfer line. This enables to suppress parasitic resistance resulting from the drive signal transfer line, and excels in a high-speed driving.

According to yet another embodiment of the present invention, an imaging device having the solid image pickup element is disclosed. This enables to downsize the solid image pickup element and the imaging device. Also, it is possible to make the imaging device relatively small even with a large light receiving surface, which enables to achieve high-speed imaging.

BRIEF DESCRIPTION OF THE DRAWINGS

FIG. 7 is an illustrative view to explain the solid image pickup element comprising vertical drive signal transfer lines, wherein the vertical drive signal transfer line includes first vertical drive signal transfer lines and a second vertical drive signal transfer line.

FIG. 10 shows an integrated circuit of a second lap structure.

FIG. 11 is an illustrative view to explain a method for connecting a pad of the solid image pickup element and a pad of the drive circuit element by means of a bump.

DESCRIPTION OF THE PREFERRED EMBODIMENTS

Hereinafter, a wiring structure according to the present invention will be explained.

Figure 1:
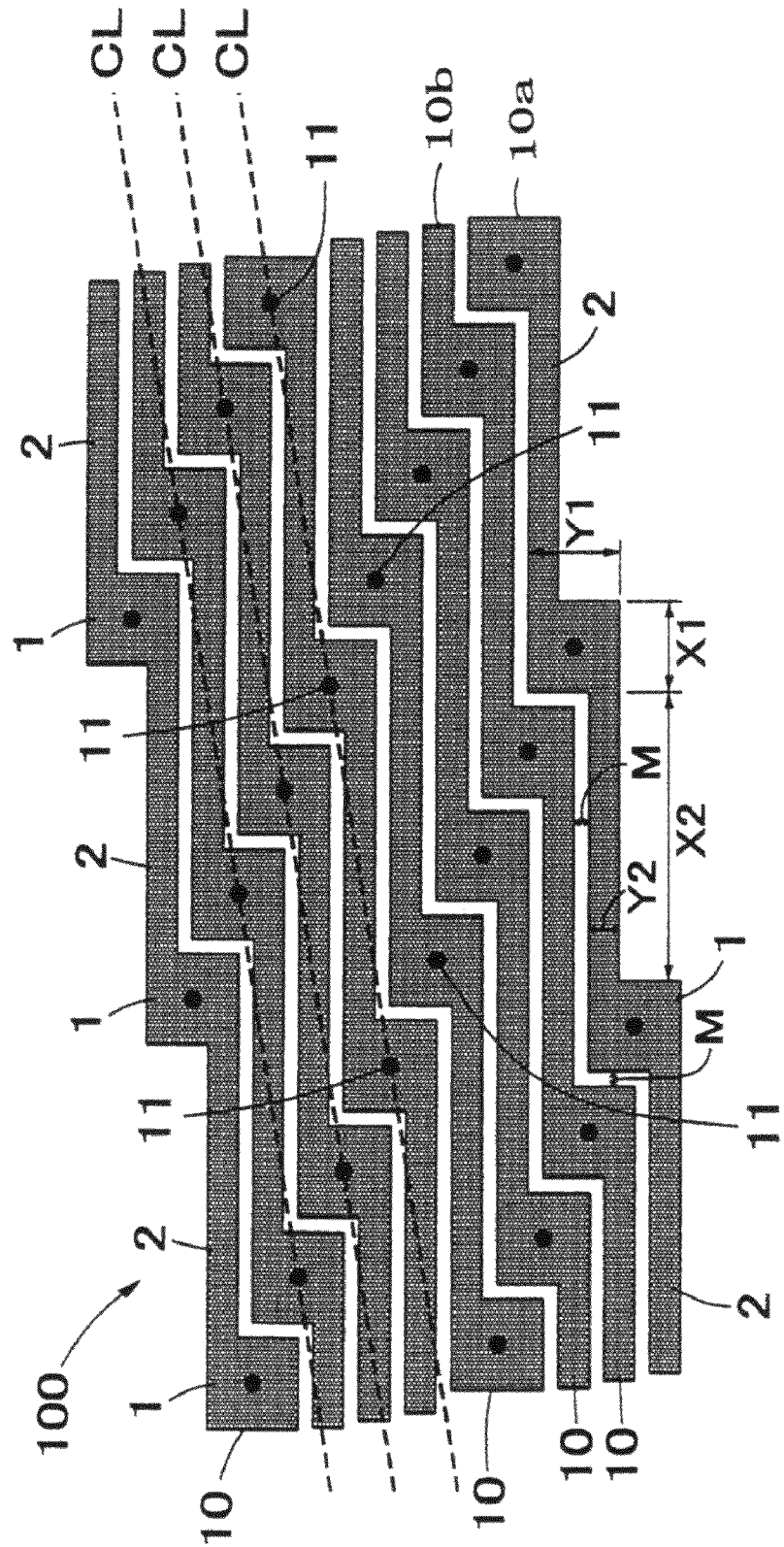
FIG. 1 shows a first embodiment of a wiring structure according to the present invention.
Figure 2:
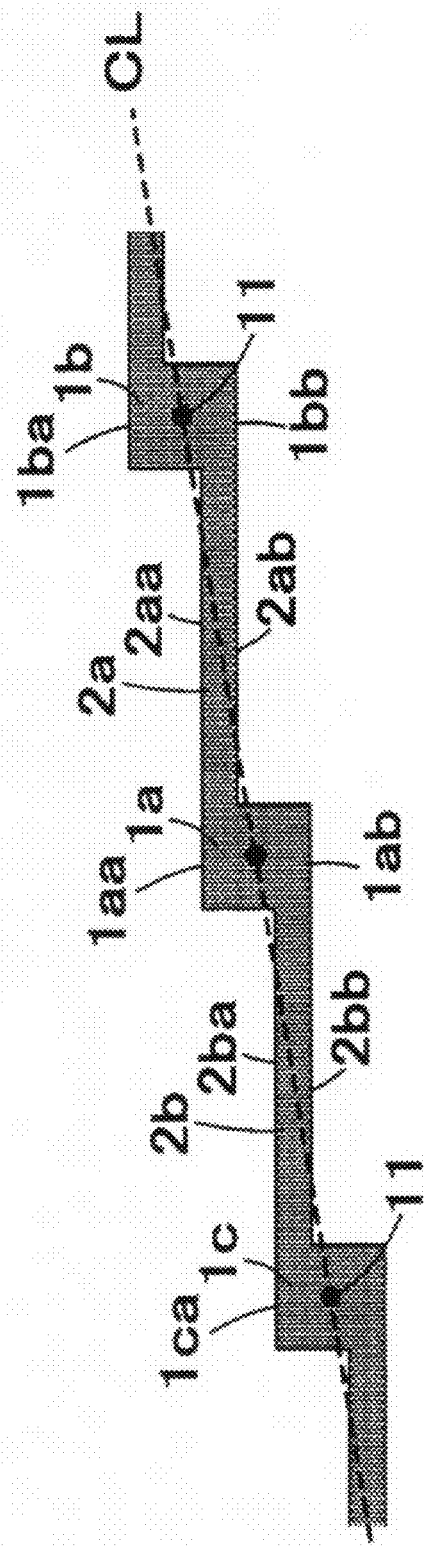
FIG. 2 shows only one wiring in the wiring structure of the first embodiment.

FIG. 1 is a plan view showing a first embodiment of a wiring structure according to the present invention. FIG. 2 is a plan view showing only one wiring in the wiring structure of the first embodiment.

Hereinafter, a wiring structure (100) of the first embodiment will be explained by referring to mainly FIG. 1 and appropriately FIG. 2.

The wiring structure (100) of the first embodiment comprises a plurality of wirings (10) aligned in parallel on a plane, and each wiring (10) comprises pads (1) and conductive wires (2).

The pad (1) is to be connected with a connecting wire (conductive wire) or a bump for connecting the wiring structure (100) with other elements and so on. The pad (1) is a quadrangle in the first embodiment. In each wiring (10), the pads (1) are positioned at a constant interval in a right and left (lateral) direction of a plane of paper.

A point (11) disposed at a center of the pad (1) represents a center of gravity of the pad (1). The pad (1) comprises indium and so on.

The conductive wires (2) are extended from both ends of the pad (1) in order to connect adjacent pads (1) to each other. The conductive wire (2) has a narrower width than the pad (1) and is a quadrangle (band-like shape) having a long side and a short side.

Hereinafter, a positional relationship between the pad (1) and the conductive wire (2) in each wiring (10) will be explained by referring to FIG. 2.

Two conductive wires (2a, 2b) are extended from a pad (1a) (shown in FIG. 2) in a parallel and opposite direction to each other. Specifically, the conductive wire (2a) is extended from a right upper end of the pad (1a) in a right direction, and the conductive wire (2b) is extended from a left lower end of the pad (1a) in a left direction.

An upper side (2aa) of the conductive wire (2a) is disposed in a same straight line as an upper side (1aa) of the pad (1a). The conductive wire (2a) is connected to a left lower end of a pad (1b) positioned next-rightward of the pad (1a). Here, a lower side (2ab) of the conductive wire (2a) is disposed in a same straight line as a lower side (1bb) of the pad (1b).

By contrast, a lower side (2bb) of the conductive wire (2b) is disposed in a same straight line as a lower side (1ab) of the pad (1a). The conductive wire (2b) is connected to a right upper end of a pad (1c) positioned next-leftward of the pad (1a). Here, an upper side (2ba) of the conductive wire (2b) is disposed in a same straight line as an upper side (1ca) of the pad (1c).

The pads (1) and the conductive wires (2) are connected one after the other in the positional relationship described above, which forms the wiring (10) in a staircase pattern.

Since the pad (1) and the conductive wire (2) are in such the positional relationship, a line (CL) (hereinafter, referred to as "gravity center line" (CL)) connecting centers of gravity (11) of respective pads (1) is a slightly sloped straight line with respect to an extension direction (right and left direction of a plane of paper) of the conductive wire (2).

Next, a positional relationship between the wirings (10) will be explained (See FIG. 1). Due to convenience of explanation, a length of a side of the pad (1) extending in a left and right direction of a plane of paper is represented as "X1", and that extending in an up and down direction of the plane of paper is represented as "Y1". A length of a side of the conductive wire (2) extending in the left and right direction of the plane of paper (long side) is represented as "X2", and that extending in the up and down direction of the plane of paper (short side) is represented as "Y2". A spacing between the wirings (10) is represented as "M".

In the wiring structure (100), the gravity center lines (CL) of the wirings (10) are positioned in parallel to each other. That is to say, the wirings (10) have a positional relationship therebetween such that one wiring (10) is lapped over another wiring (10) when the one wiring (10) is obliquely parallel-displaced.

Specifically, a wiring (10b) shown in FIG. 1 is positioned where a wiring (10a) is parallel-displaced (X1+M) in the left direction of the plane of paper and (Y2+M) in the up direction of the plane of paper.

Such the positional relationship makes it possible to have a spacing (M) between wirings (10).

Also, the spacing (M) between wirings (10) is preferably as small as technology allows (minimum wiring spacing). Because (M) is the minimum wiring spacing, it is possible to highly integrate wirings and reduce the wiring area. Here, the minimum wiring spacing does not produce an electrical connection between adjacent wirings (10).

However, if (M) is not able to be as small as the above-mentioned spacing due to a performance of an exposure device and so on, a minimum spacing achieved by the performance of the exposure device and so on is referred to as the minimum wiring spacing.

In addition, although the spacing (M) between wirings (10) is constant in the above explanation, the spacing (M) between wirings (10) is not necessarily constant as far as it is more than the minimum wiring spacing. That is, the spacing (M) may be appropriately designed depending on width, length, shape and so on of the wiring (10).

As a method for connecting the wiring (10) of the wiring structure (100) with other wirings, a method for connecting the wirings (10) of the wiring structure (100) with wirings of a second wiring structure (200) may be exampled (see FIG. 3), wherein the wirings of the second wiring structure (200) disposed at a right angle to the gravity center line (CL) of the wiring (10) of the wiring structure (100) are aligned in parallel. Such the connection of the wiring structure (100) with other wirings allows to produce an element having a complex structure.

The wirings of the second wiring structure (200) traverse the wiring structure (100), and the wiring structure (100) has highly integrated wirings and their wiring area is small. Therefore, this results in shortening the wirings of the second wiring structure (200) and reducing parasitic resistance of the wirings of the second wiring structure (200).

Figure 3:
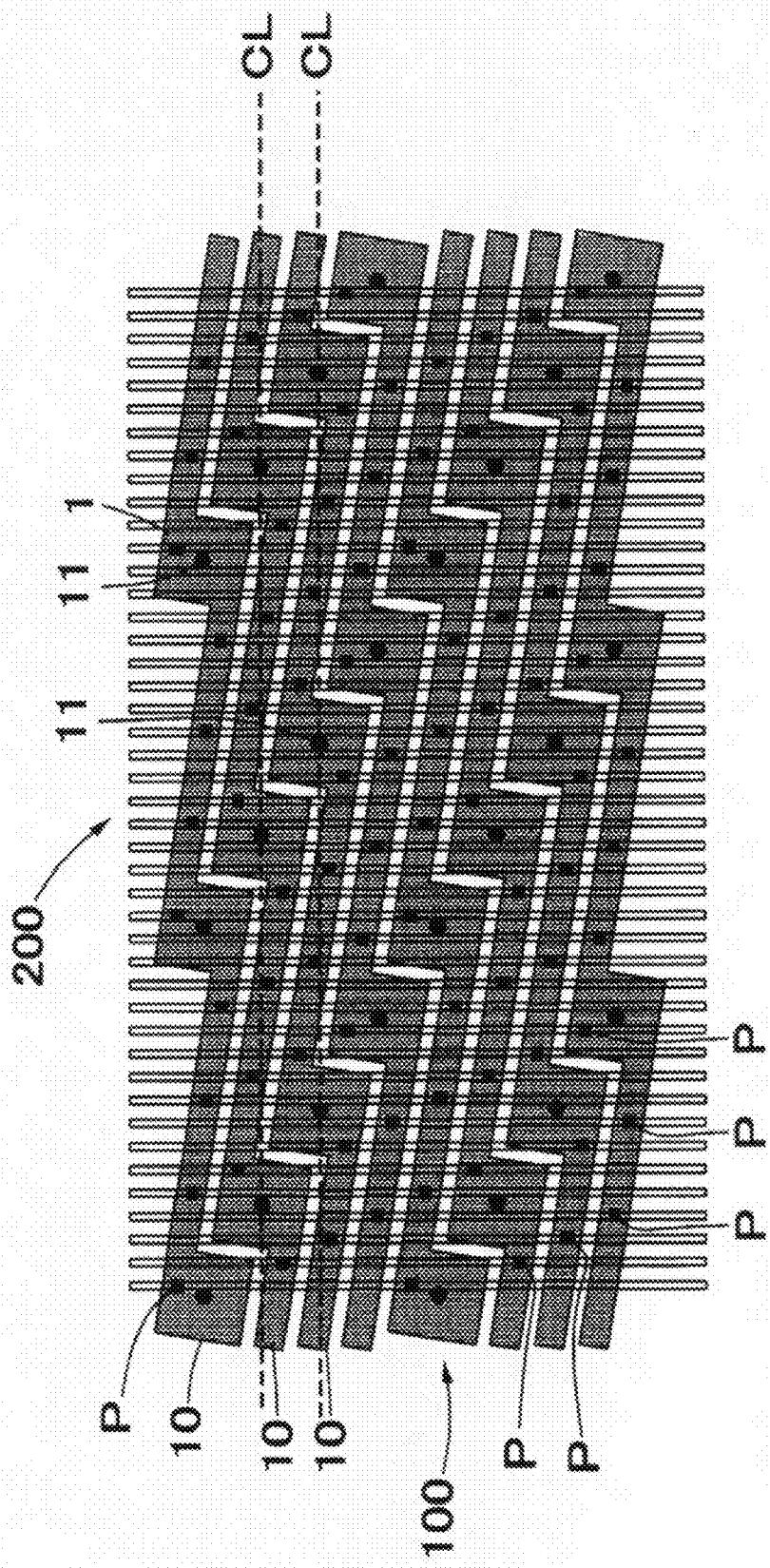
FIG. 3 shows a connection of the first wiring structure and a second wiring structure.

In addition, a square point (P) shown in FIG. 3 represents a connection point of the wiring (10) of the wiring structure (100) and the wiring of the second wiring structure (200), and these wirings are not connected to each other in any place other than the connection points (P).

Further, the second wiring structure (200) may comprise wirings aligned in parallel to the gravity center line (CL), although not shown in FIG. 3.

Figure 4:
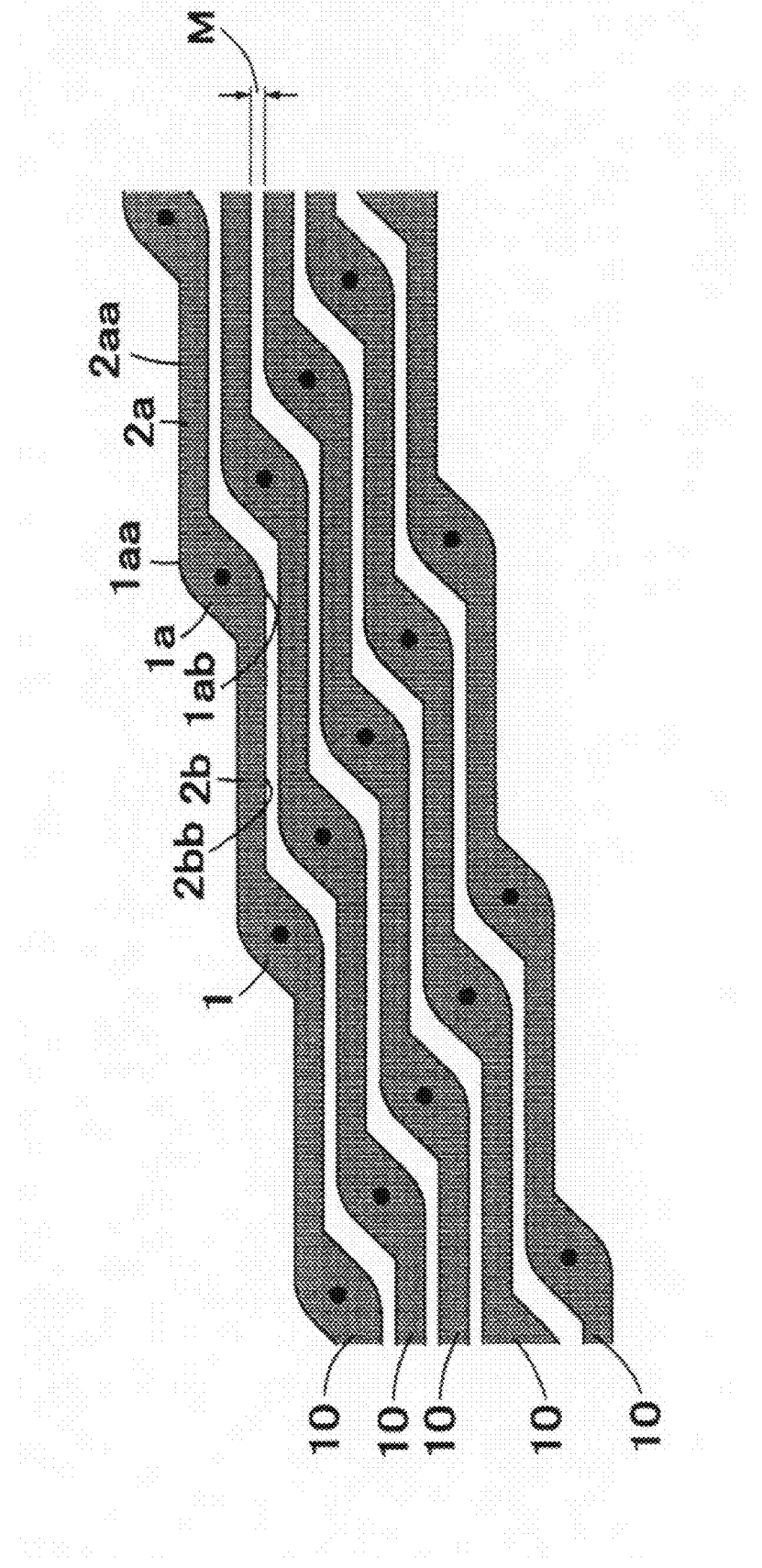
FIG. 4 shows a second embodiment of a wiring structure according to the present invention.

The above-mentioned wiring structure (100) comprises the pad (1) having a quadrangular shape, however, the shape of the pad (1) is not limited thereto in the wiring structure according to the present invention. For example, the pad (1) may be oval as shown in FIG. 4 (second embodiment).

However, when the pad (1) is oval, it is necessary in two conductive wires (2a, 2b) extended from one pad (1a) that an upper side (2aa) of the conductive wire (2a) extending in a right direction is disposed in a same straight line as an uppermost end (1aa) of the pad (1a) and a lower side (2bb) of the conductive wire (2b) extending in a left direction is disposed in a same straight line as a lowermost end (1ab) of the pad (1a) (Condition 1).

This Condition 1 should be satisfied in relationships between other pads (1) and conductive wires (2).

If Condition 1 is not satisfied, i.e., the uppermost end (1aa) of the pad (1a) projects upward from the upper side (2aa) of the conductive wire (2a) and/or the lowermost end (lab) of the pad (1a) projects downward from the lower side (2bb) of the conductive wire (2b), such structures are not preferable. The reason is that a reduction of the spacing (M) between the conductive wires (2) in adjacent wirings (10) to the minimum wiring spacing causes a reduction of the spacing between the pad (1) of the one wiring (10) and the conductive wire (2) of its adjacent wiring (10) to less than the minimum wiring spacing, which generates an electrical connection therebetween.

The shape of the pad is not limited to the above-mentioned shapes, however, Condition 1 should be satisfied in such the cases.

Next, an integrated circuit having the wiring structure according to the present invention will be explained by taking an integrated circuit comprising a solid image pickup element and a drive circuit element for example. Here, "integrated circuit" is an electronic circuit having a plurality of elements.

Figure 5:
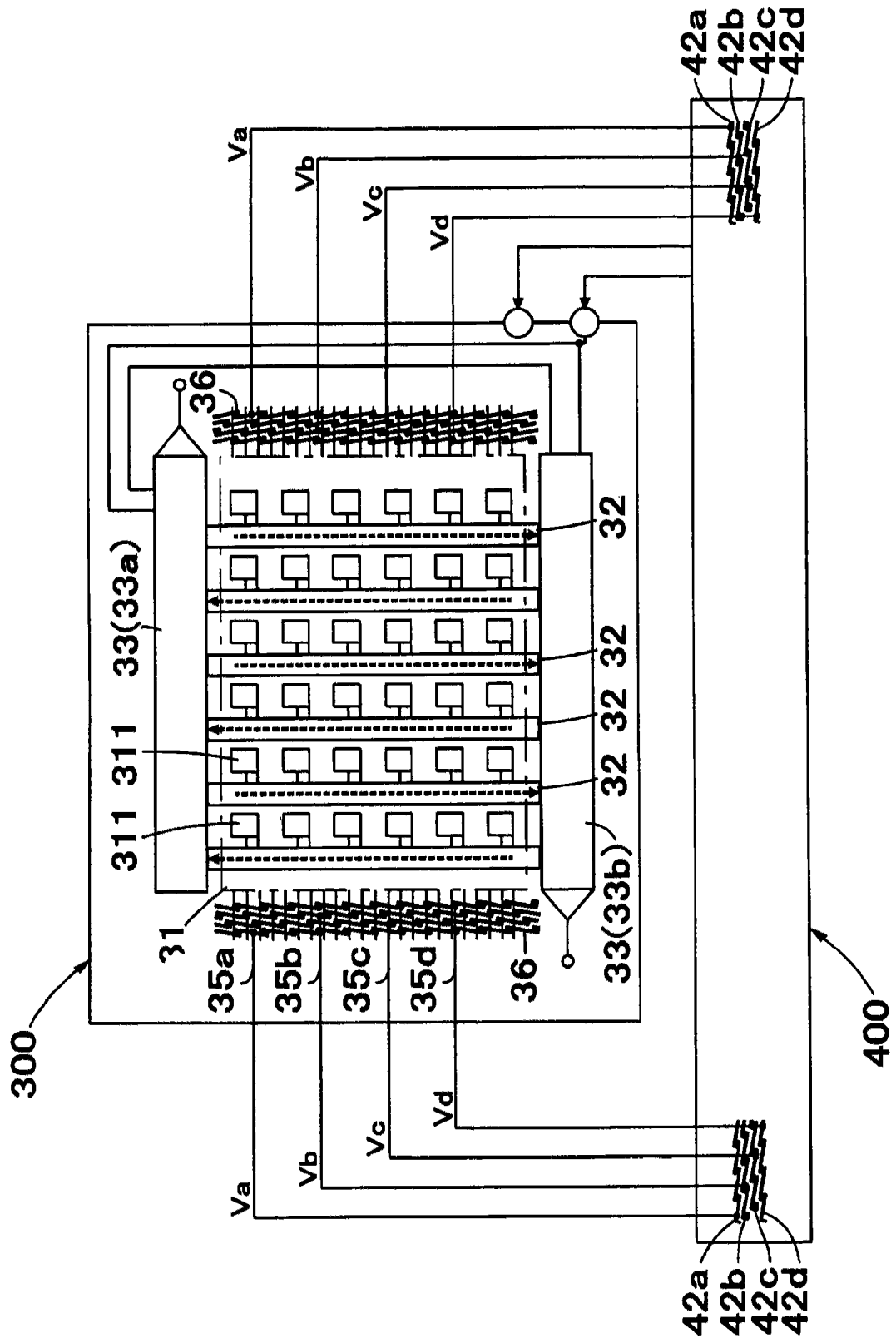
FIG. 5 shows an integrated circuit having a solid image pickup element and a drive circuit element.

FIG. 5 is a plan view showing an integrated circuit having a solid image pickup element (300) and a drive circuit element (400).

Figure 6:
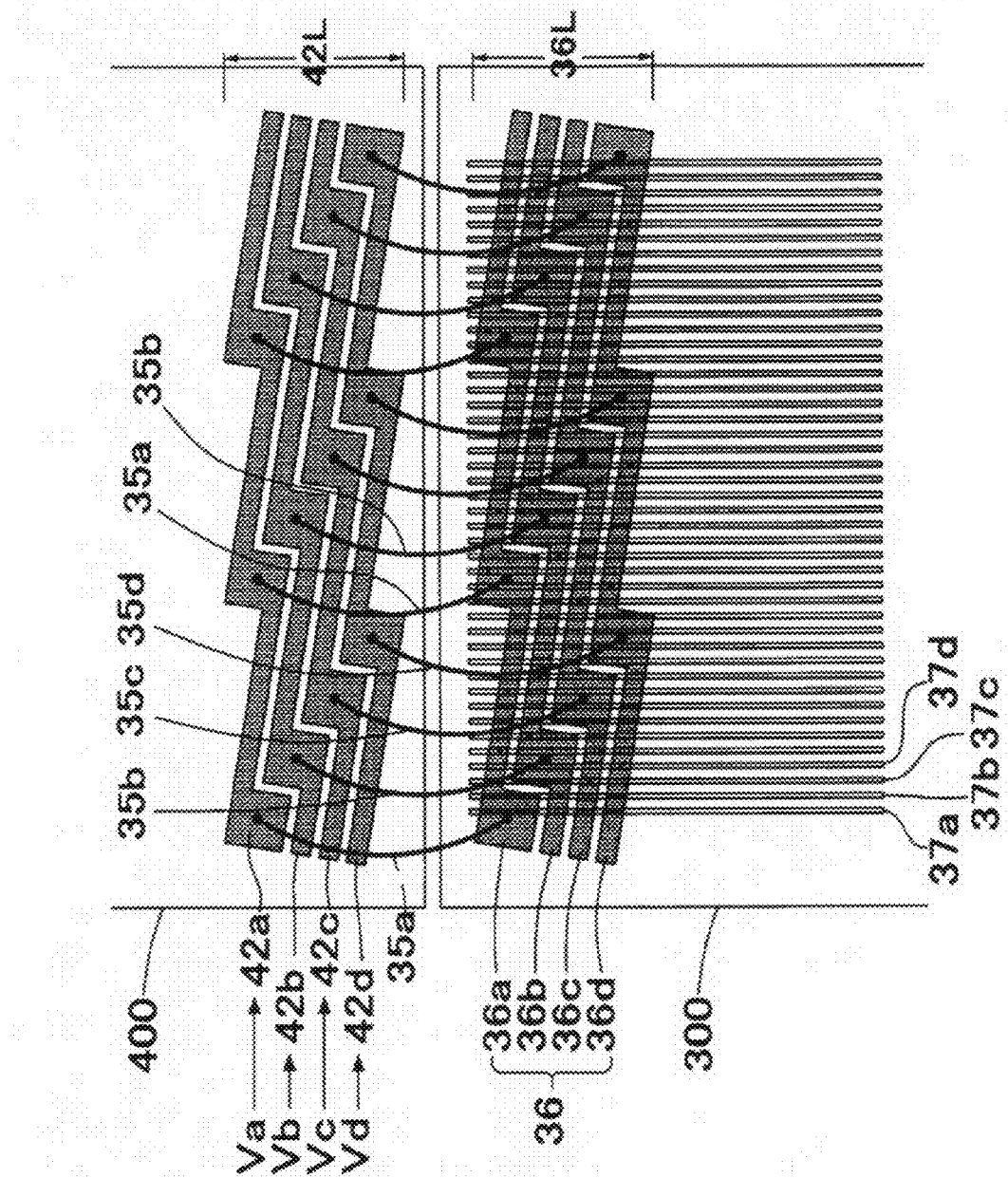
FIG. 6 shows a connecting portion of the solid image pickup element and the drive circuit element.

FIG. 6 is a plan view showing a connecting portion of the solid image pickup element (300) and the drive circuit element (400).

For convenience of illustration, FIG. 5 and FIG. 6 are shown in different measurements, such as a distance between the solid image pickup element (300) and the drive circuit element (400).

The solid image pickup element (300) is a back-illuminated type and comprises a pixel section (31), a vertical transfer register (32) and a horizontal transfer register (33).

In the pixel section (31), a plurality of pixels (311) having light receiving elements such as photodiode are arranged in a line-column pattern (matrix).

Also, the pixel section (31) preferably has an amplifier circuit in each pixel (311) in order to amplify a charge signal generated in the pixel (311). This enables to make the charge signal higher than a noise level resulting from a switching during a readout stage and a stray capacitance in a readout path and improve S/N ratio (Signal to Noise ratio) when the charge signal is read out from the pixel.

Lines of the pixel line-column pattern are extended in a right and left direction of a plane of paper, and columns thereof are extended in an up and down direction of the plane of paper.

The vertical transfer registers (32) are provided along the pixel columns, and they are for reading out the charge signal generated from the light receiving elements in the pixels (311) and transferring it to the horizontal transfer register (33).

The vertical transfer register (32) is driven by an input of a drive signal (this signal is for a vertical driving in the present embodiment so that it is referred to as "vertical drive signal") from the drive circuit element (400).

Specifically, the vertical drive signal from a drive signal output section (42) in the drive circuit element (400) is sequentially transferred through a connecting wire (35), a busline section (36) and a drive signal transfer line (37) (this transfer line is for transferring a vertical drive signal in the present embodiment so that it is referred to as "vertical drive signal transfer line (37)") and inputted into the vertical transfer register (32).

The input of the vertical drive signal into the vertical transfer register (32) will be explained later with details.

The horizontal transfer register (33) comprises a first horizontal transfer register (33a) disposed above the pixel section (31) and a second horizontal transfer register (33b) disposed below the pixel section (31), and it is for reading out a charge signal transferred from the vertical transfer register (32) to outside the element.

Specifically, the first horizontal transfer register (33a) transfers a charge transferred from the vertical transfer registers (32) positioned at odd columns from the right in FIG. 5, and the second horizontal transfer register (33b) transfers a charge transferred from the vertical transfer registers (32) positioned at even columns from the right in FIG. 5.

Further, the horizontal transfer register (33) is driven by a horizontal drive signal inputted from the drive circuit element (400).

Next, an input of the vertical drive signal into the vertical transfer register (32) will be explained. Hereinafter, a solid image pickup element adopting a quadri-phase drive system will be used as an example.

The present embodiment is a quadri-phase drive system, and a vertical drive signal outputted from a drive signal output section (42) of the drive circuit element comprises a first vertical drive signal (Va), a second vertical drive signal (Vb), a third vertical drive signal (Vc), and a fourth vertical drive signal (Vd).

Specifically, the drive signal output section (42) comprises first to fourth drive signal output sections (42a, 42b, 42c, 42d). The first vertical drive signal (Va) is outputted from the first drive signal output section (42a), the second vertical drive signal (Vb) is outputted from the second drive signal output section (42b), the third vertical drive signal (Vc) is outputted from the third drive signal output section (42c), and the fourth vertical drive signal (Vd) is outputted from the fourth drive signal output section (42d).

The first to fourth drive signal output sections (42a, 42b, 42c, 42d) are connected to the busline section (36) via the connecting wire (35), and the vertical drive signal is sequentially transferred therethrough.

The connecting wire (35) comprises first to fourth connecting wires (35a, 35b, 35c, 35d), and the busline section (36) comprises first to fourth buslines (36a, 36b, 36c, 36d). The first drive signal output section (42a) is connected to the first busline (36a) via the first connecting wire (35a), the second drive signal output section (42b) is connected to the second busline (36b) via the second connecting wire (35b), the third drive signal output section (42c) is connected to the third busline (36c) via the third connecting wire (35c), and the fourth drive signal output section (42d) is connected to the fourth busline (36d) via the fourth connecting wire (35d). The vertical drive signal is sequentially transferred therethrough.

Here, the drive signal output section (42) and the busline section (36) comprises the above-mentioned wiring structure (100). Therefore, it is possible to reduce a spacing between wirings (buslines) comprised in the drive signal output section (42) and in the busline section (36) and reduce a width (42L) of the drive signal output section and a width (36L) of the busline section.

That is, the wirings (busline) are highly integrated in the drive signal output section (42) and the busline section (36), which enables to downsize the drive circuit element (400) and the solid image pickup element (300) as a whole.

Especially, since the solid image pickup element (300) comprises the busline sections (36) at left and right sides of the solid image pickup element (300) in FIG. 5, a use of the wiring structure (100) at the both sides enables to further downsize the solid image pickup element (300).

The first to fourth buslines (36a, 36b, 36c, 36d) are connected to the vertical drive signal transfer line (37).

The vertical drive signal transfer line (37) is classified into the first to fourth vertical drive signal transfer lines (37a, 37b, 37c, 37d). The first vertical drive signal transfer line (37a) is connected to the first busline (36a), the second vertical drive signal transfer line (37b) is connected to the second busline (36b), the third vertical drive signal transfer line (37c) is connected to the third busline (36c), and the fourth vertical drive signal transfer line (37d) is connected to the fourth busline (36d).

In this way, the drive signal transferred to the busline section (36) is able to be transferred to the vertical drive signal transfer line (37). Because the vertical drive signal transfer line (37) is connected to the vertical transfer register (32), the vertical drive signal is transferred to each pixel via the vertical transfer register (32).

Here, the busline section (36) has a small width (36L) because of comprising the wiring structure (100), which enables to shorten the vertical drive signal transfer line (37) configured to traverse the busline section (36).

The shorten vertical drive signal transfer line (37) reduces parasitic resistance in the vertical drive signal transfer line (37) and achieves high speed driving of the solid image pickup element (300).

That is, the reduced parasitic resistance due to the shorten width (36L) enables to achieve high speed driving of the solid image pickup element (300) and speed up the imaging device, since an imaging device with a solid image pickup element having a large parasitic resistance contributes to obstruct the speed-up.

The vertical drive signal transfer line (37) may be divided into a busline section vertical drive signal transfer line (371) traversing a paper front surface of the busline section (front surface of the solid image pickup element (300)) and a pixel section vertical drive signal transfer line (372) traversing a paper front surface of the pixel section (31) (front surface of the solid image pickup element (300)).

In this case, it is preferable that the pixel section vertical drive signal transfer line (372) is thicker than the busline section vertical drive signal transfer line (371) and that a plurality of the busline section vertical drive signal transfer lines (371) (four in FIG. 7(a)) are connected to the one pixel section vertical drive signal transfer line (372) as shown in FIG. 7 (a).

This enables to thicken the pixel section vertical drive signal transfer line (372) and reduce its parasitic resistance. In addition, the solid image pickup element (300) is a back-illuminated type so that light enters from an opposite side of a face on which the pixel section vertical drive signal transfer line (372) is provided. Therefore, the thicken pixel section vertical drive signal transfer line (372) does not intercept the entry of light.

However, the vertical drive signal inputted into the pixel section vertical drive signal transfer line (372) should be an identical drive signal.

FIG. 7(b) is an enlarged view of the area (A) in FIG. 7(a), and a point connecting the busline section (36) and the busline section vertical drive signal transfer line (371) is indicated as "P". In FIG. 7(b), the connecting wire (35) is not shown for illustrative convenience.

As shown in FIG. 7(b), the plurality of the busline section vertical drive signal transfer lines (371) (four in FIG. 7) connected to the one pixel section vertical drive signal transfer line (372) are all connected to one wiring of the busline section (36). Here, because each type among the vertical drive signals (Va-Vd) outputted from the drive signal output section (42) is inputted into each wiring of the busline section (36), only one type of the vertical drive signal is inputted into the one pixel section vertical drive signal transfer line (372).

For example, the pixel section vertical drive signal transfer line (372a) in FIG. 7 (b) is connected to only the first busline (36a) via the busline section vertical drive signal transfer line (371). Here, because only the first vertical drive signal (Va) is inputted into the first busline (36a), only the first vertical drive signal (Va) is inputted into the pixel section vertical drive signal transfer line (372a) connected to only the first busline (36a).

Similarly, only the second vertical drive signal (Vb) is inputted into the pixel section vertical drive signal transfer line (372b) connected to the second busline (36b), only the third vertical drive signal (Vc) is inputted into the pixel section vertical drive signal transfer line (372c) connected to the third busline (36c), and only the fourth vertical drive signal (Vd) is inputted into the pixel section vertical drive signal transfer line (372d) connected to the fourth busline (36d).

In addition, a thin wiring (not shown) is extended from the pixel section vertical drive signal transfer line (372). The pixel section vertical drive signal transfer line (372) is connected to each pixel (311) (or pixel group comprising a plurality of pixels (311)) via the thin wiring, which allows to transfer the vertical drive signal to each pixel (or pixel group).

FIGS. 5 to 7 show the integrated circuit having a structure (hereinafter, referred to as "plain structure") in which the solid image pickup element (300) and the drive circuit element (400) are aligned and connected to each other in the same plain surface.

However, it is possible to exemplify an integrated circuit having a structure (hereinafter, referred to as "lap structure") in which a solid image pickup element (300) and a drive circuit element (400) are lapped and connected to each other.

Figure 8:
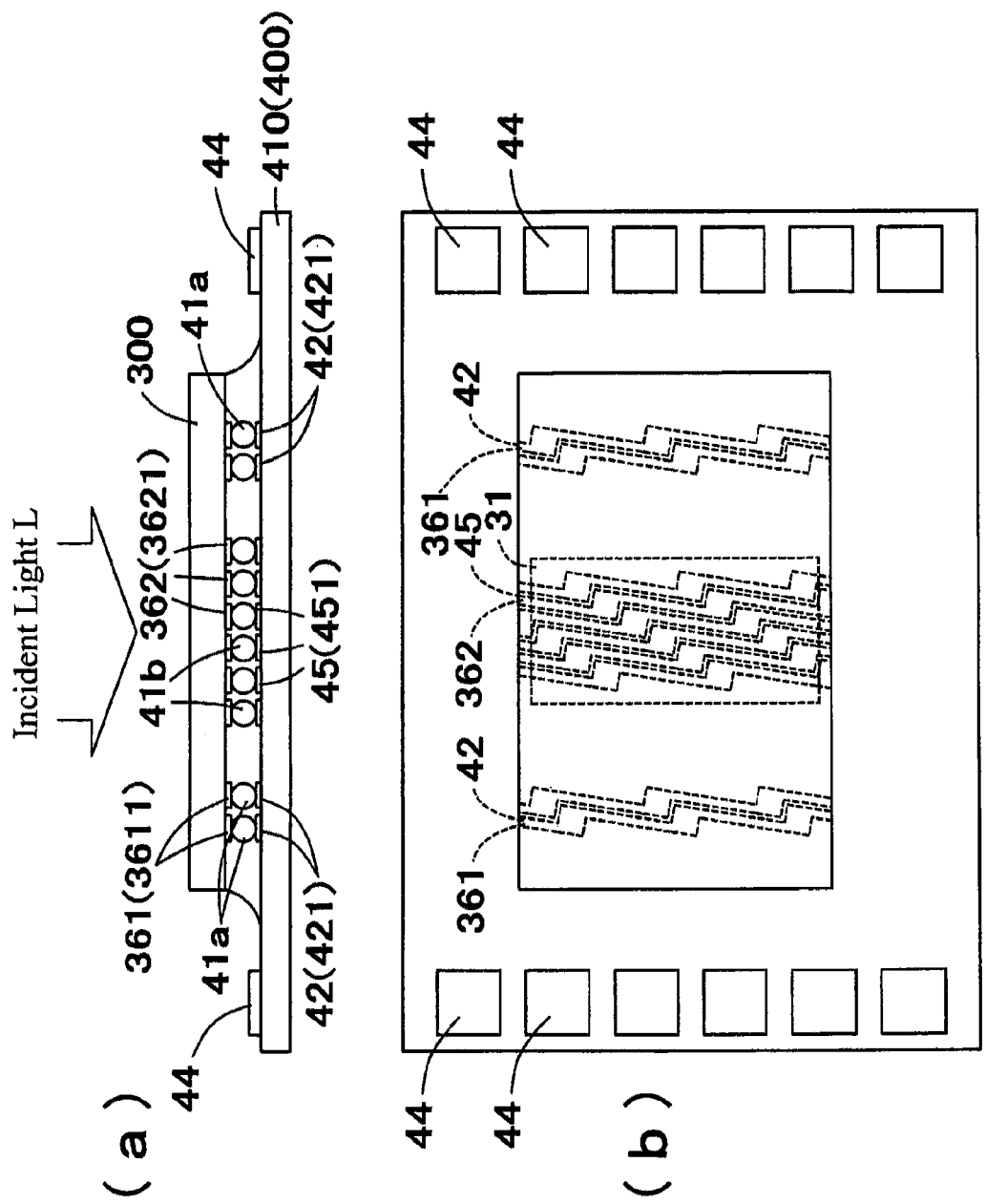
FIG. 8 shows an integrated circuit of a first lap structure.

FIG. 8 shows an integrated circuit having a structure (hereinafter, referred to as "first lap structure") in which a solid image pickup element (300) and a signal processing chip (410) (including a drive circuit element (400)) are lapped and connected to each other via bumps (41a, 41b), (a) is a side view and (b) is a plan view.

In FIG. 8, components which are the same as the one described in FIGS. 5 to 7 are indicated with the same reference numbers and their explanations are omitted.

A pixel busline section (362), a charge signal input section (45) and a bump (41b) in FIG. 8(a) are expected to be respectively lapped to another adjacent one in a right and left direction of a plane of paper in practice.

However, for explanation convenience, the pixel busline section (362), the charge signal input section (45) and the bump (41b) are illustrated not to be respectively lapped to another adjacent one in the right and left direction of the plane of paper.

As a result, the area showing the pixel busline section (362), the charge signal input section (45) and the bump (41b) is illustrated to have a larger width in a left and right direction in FIG. 8(a) than it really is.

Although the drive signal output section (42) in the plain structure is explained to output the vertical drive signal, a drive signal output section (42) in the tridimensional structure does not output the vertical drive signal like the plain structure and it outputs a wide variety of drive signals for driving the solid image pickup element (300).

The signal processing chip (410) connected to the solid image pickup element (300) comprises a signal transfer element and various associated elements in addition to the drive circuit element (400).

Here, the signal transfer element is for receiving an output from the solid image pickup element (300) in order to process a charge signal.

The charge signal generated from a light receiving element in a pixel (311) is read out by the signal transfer element in the first lap structure, although it is read out by the vertical transfer register (32) and the horizontal transfer register (33) in the plain structure of FIG. 5.

The details will be explained later.

The signal processing chip (410) is lapped on a front surface of the solid image pickup element (300) (lower side of a paper of FIG. 8 (a)). The solid image pickup element (300) is a back-illuminated type so that light enters from the back surface side, which does not block out the incident light even though the signal processing chip (410) is disposed on the front surface.

The lap of the solid image pickup element (300) and the signal processing chip (410) enables to further reduce a mounting area of the integrated circuit compared to the plain structure in which elements are aligned in the same plain surface.

In addition, the signal processing chip (410) has a larger area than the solid image pickup element (300). Then, pads (44) are provided in outward positions of the signal processing chip (410) and elements other than the solid image pickup element (300) are connected to the pads (44).

The solid image pickup element (300) comprises a busline section (36) on a periphery of a pixel section (31) and over an entire front surface of the pixel section (31).

Hereinafter, the busline section on the periphery of the pixel section (31) is referred to as "peripheral busline section (361)" and the busline section over the entire front surface of the pixel section (31) is referred to as "pixel busline section (362)".

The peripheral busline section (361) of the solid image pickup element (300) is connected to the drive signal output section (42) of the drive circuit element (400).

Specifically, both the peripheral busline section (361) and the drive signal output section (42) comprise the above-mentioned wiring structure (100), and respective pads (3611, 421) are connected to each other via a bump (41a) for connecting the peripheral busline section (361) and the drive circuit element (400).

The drive signal outputted from the drive signal output section (42) of the driving circuit element (400) is inputted into the solid image pickup element (300). Specifically, the drive signal outputted from the drive circuit element (400) is transferred from the peripheral busline section (361) to each pixel (311) though the drive signal transfer line, like the plain structure.

In addition, because both the peripheral busline section (361) and the drive signal output section (42) comprise the wiring structure (100), they are lapped and disposed in the same position in FIG. 8(b).

In the pixel busline section (362) of the solid image pickup element (300), respective wirings (busline) are connected to a pixel group consisting of a plurality of the pixels (311) positioned in lengthwise and crosswise directions (line-column). Specifically, a thin wiring (not shown) extended from each pixel (311) is connected to a corresponding wiring (busline).

The pixel busline section (362) is connected to the signal transfer element of the signal processing chip (410). A portion of the signal transfer element to be connected to the pixel busline section (362) is referred to as "charge signal input section (45)".

Here, both the pixel busline section (362) and the charge signal input section (45) comprise the above-mentioned wiring structure (100), and respective pads (3621, 451) are connected to each other via a bump (41b) for connecting the pixel busline section (362) and the signal transfer element. Then, the charge signal generated from the light receiving element in the pixel (311) is sequentially transferred through the pixel busline section (362) and the bump (41b) to the signal transfer element and read out to the outside of the signal processing chip (410).

Here, the use of the wiring structure (100) in the pixel busline section (362) highly integrates the wirings, which results in increasing the number of wirings (busline) disposed in the pixel section (31) and reducing the number of pixels connected to each wiring (busline).

That is, this allows to transfer the charge signal to the signal transfer element by small number of pixels and to accept a complicated connection of the solid image pickup element (300) and the signal transfer element.

Because both the pixel busline section (362) and the charge signal input section (45) comprise the wiring structure (100), they are lapped and disposed in the same position in FIG. 8(b).

In FIG. 8 (b), each wiring (busline) in the peripheral busline section (361) and the pixel busline section (362) is extended from one end of the pixel section (31) (upper end of the pixel section (31) in FIG. 8 (b)) to the other end thereof (lower end of the pixel section (31) in FIG. 8 (b)).

However, a single wiring (busline) is not necessarily extended from the one end to the other end of the pixel section (31), and the formation may be appropriately designed by means of a connecting method of each pixel and the signal transfer element.

In addition, the busline section (361) of the solid image element connected to the drive signal output section (42) is provided on the periphery of the pixel section (31) in FIG. 8, it may be provided on a front surface of the pixel section (31) like the pixel busline section (362).

In this case, the busline section connected to the drive signal output section (42) allows to transfer the drive signal to each pixel (311) by connecting the each wiring (busline) to the pixel group consisting of a plurality of the pixels (311) positioned in lengthwise and crosswise directions (line-column), like the busline section (362) connected to the signal transfer element.

Especially, the use of the wiring structure (100) in the busline section highly integrates wirings, which results in reducing the number of pixels connected to the each wiring (busline) even though the busline section connected to the drive signal output section (42) is disposed on the front surface of the pixel section (31).

Therefore, this enables to accept a complicated connection of the solid image pickup element (300) and the signal processing chip (410).

Next, an imaging device (500) comprising an integrated circuit having a solid image pickup element (300) and a drive circuit element (400) will be explained.

Figure 9:
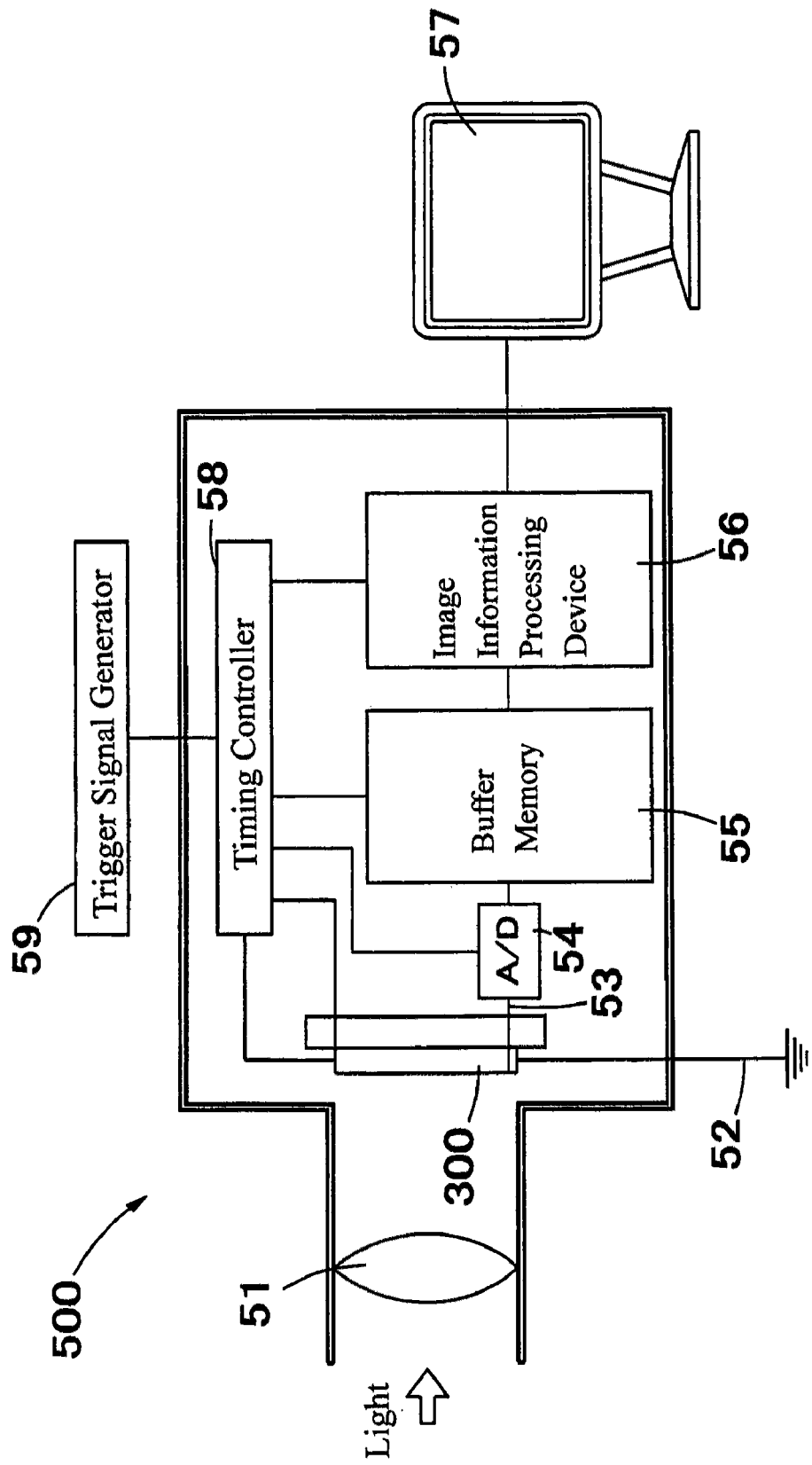
FIG. 9 shows an imaging device of the present invention.
Figure 12:
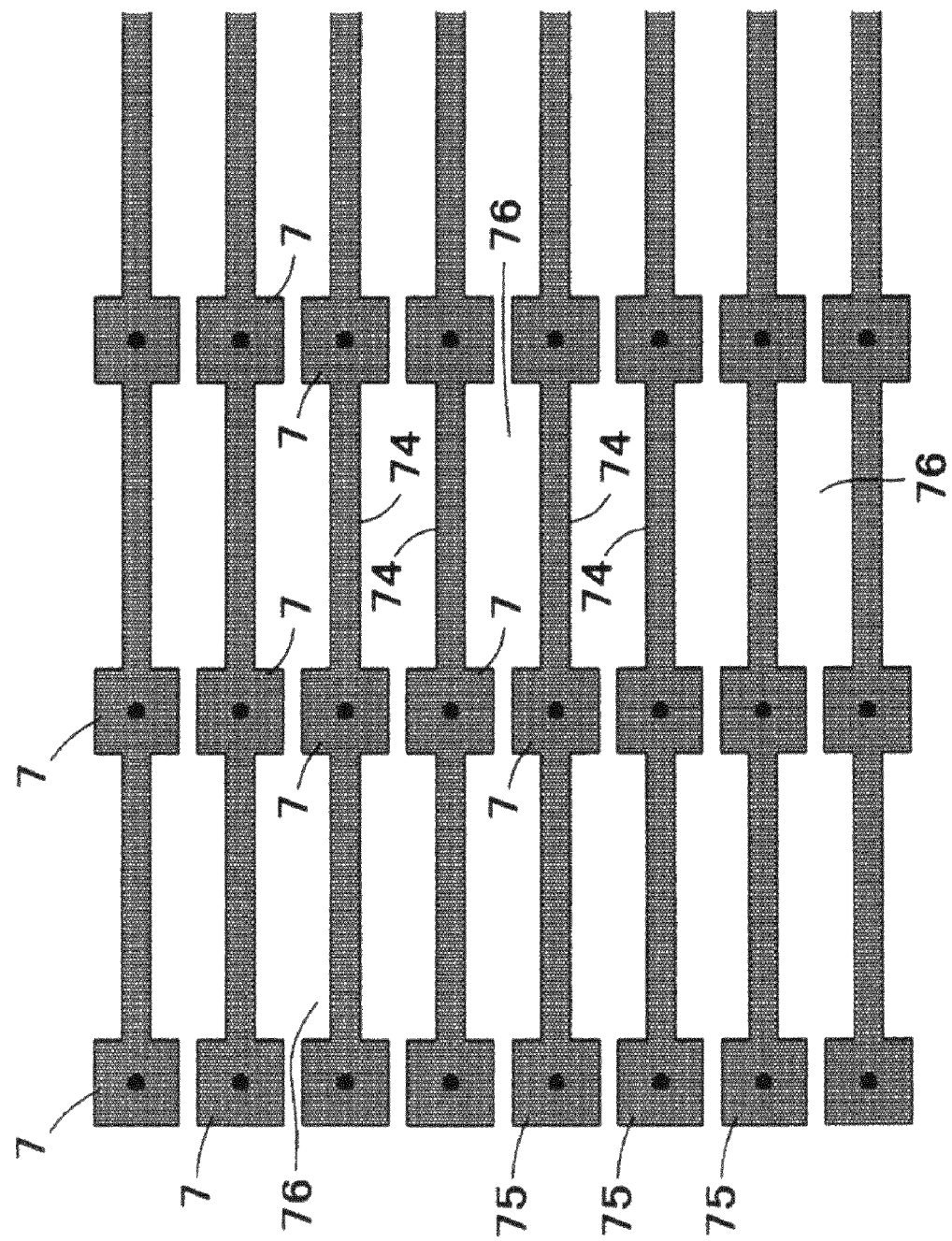
FIG. 12 shows a conventional wiring structure in which wirings comprising pads and conductive wires are aligned.

FIG. 9 shows an entire structure of the imaging device (500). Here, the drive circuit element (400) is incorporated into a timing controller (58) and not shown in FIG. 9.

Light entering into a lens (51) is focused onto a light receiving surface of the solid image pickup element (300). A charge signal is generated depending on an intensity of incident light during the imaging, and an excess charge due to excess incident light is released to a grounding wire via a drain line (52).

After the imaging, the charge signal (image information) stored in the solid image pickup element (300) is transferred through a signal output line (53) and converted into digital information by means of a AD converter (54) and stored in a buffer memory (55).

The image information stored in the buffer memory (55) is converted into a series of image information shots and outputted to the outside of the high speed imaging device. The image information is able to be seen with eyes as an image by a monitor (57).

The imaging device (500) comprises the timing controller (58) for controlling the entire device.

A trigger signal generator (59) is connected to the timing controller (58). The trigger signal generator (59), for example, observes a brightness change of an imaging subject and outputs a trigger signal for commanding an imaging stop instruction to the timing controller (58) when a certain condition is satisfied.

The solid image pickup element (300) and the drive circuit element (400) used in the imaging device (500) have a small mounting area, which results in downsizing the imaging device.

In addition, the small solid image pickup element (300) does not increase the size of the imaging device even with a large light receiving surface, which enables to provide a good quality image even when a high-speed imaging is performed.

Further, a use of the wiring structure (100) in the solid image pickup element (300) reduces parasitic resistance of a vertical drive signal transfer line and so on. This enables to drive the solid image pickup element in high speed, and results in the imaging device appropriate for the high speed imaging.

In the explanation of the above-mentioned solid image pickup element (300) and the imaging device (500), the element (or chip) connected to the solid image pickup element (300) is only the drive circuit element (400) (or signal processing chip (410)).

However, it is possible to connect more than three elements or chips together.

FIG. 10 shows a structure (hereinafter, referred to as "second lap structure") in which four elements are lapped and connected to each other, and (a) is an illustrative side view and (b) shows around the pad of a connecting portion.

In FIG. 10 (*a*), four elements (60*a*, 60*b*, 60*c*, 60*d*) aligned in an up and down direction of a plane of paper are respectively provided with connection parts (61*a*, 61*b*, 61*c*, 61*d*) that are for being connected to other elements.

Specifically, connection parts (61*a*, 61*d*) are provided at only one side of the elements in both ends (60*a*, 60*d*), and connection parts (61*b*, 61*c*) are provided at both sides of the center elements (60*b*, 60*c*). The connection parts (61*a*, 61*b*, 61*c*, 61*d*) are connected to each other in order to connect the four elements (60*a*, 60*b*, 60*c*, 60*d*).

Here, the connection parts (61*a*, 61*b*, 61*c*, 61*d*) comprise the above-mentioned wiring structure (100), and each pad (62*a*, 62*b*, 62*c*, 62*d*) is provided with a through-hole (63) passing through the each element as shown in FIG. 10(*b*).

A pier (64) comprising copper and so on and having a diameter of a few microns to a few ten microns passes though the through-hole (63) and connect the elements to each other. In addition, FIG. 10(*b*) shows around the pad (62*c*) as an example.

The second lap structure enables to lap and connect a plurality of elements and reduce the mounting area compared to the plain structure in which the elements are aligned in the same plain surface. Further, it is possible to connect a great number of elements to each other, and the structure is appropriately used in a memory and the like.

Industrial Applicability

The integrated circuit and the solid image pickup element comprising the wiring structure according the present invention are appropriately used in a variety of devices such as imaging devices.

What is claimed is:

1. An integrated circuit comprising at least two elements, each element having a wiring structure, the wiring structure comprising:
    a plurality of wirings aligned in parallel on a plane, each wiring comprising:
        a plurality of pads aligned at a substantially constant interval in a left and right direction; and
        a plurality of conductive wires for connecting adjacent pads, the conductive wires having a narrower width than the pads, two conductive wires being extended from one pad in a parallel and opposite direction, one of the two conductive wires having an upper side disposed in a same straight line as an uppermost end of the one pad and the other conductive wire having a lower side disposed in a same straight line as a lowermost end of the one pad, and a gravity center line connecting centers of gravity of all the pads in the wiring and being a straight line not parallel to an extension direction of the conductive wires; and
    wherein a plurality of the gravity center lines in the plurality of wirings are parallel to each other,
    adjacent wirings of the plurality of wirings are spaced more than a minimum wiring spacing, and
    a pad of the wiring structure of the one element and a pad of the wiring structure of the other element are connected to each other.

2. The integrated circuit according to claim 1, wherein the pad is a quadrangle having an upper side and a lower side,
    one of the two conductive wires extended from the one pad has a lower side disposed in a same straight line as a lower side of the one pad and the other conductive wire has an upper side disposed in a same straight line as an upper side of the one pad.

3. The integrated circuit according to claim 2, wherein the one element and the other element are lapped each other, and
    the pads of the wiring structures of respective elements are connected to each other by a bump.

4. The integrated circuit according to claim 2, wherein a plurality of the elements are lapped each other, and
    the pads of the wiring structures of respective elements are connected to each other by a pier, the pier configured to pass through the pad.

5. The integrated circuit according to claim 1, further comprising a second wiring structure connected to the wiring structure described in claim 1, wherein
    the second wiring structure comprises a plurality of wirings aligned in parallel or right angle to the gravity center line connecting centers of gravity of all the pads in the wiring of the wiring structure.

6. The integrated circuit according to claim 5, wherein the one element and the other element are lapped each other, and
    the pads of the wiring structures of respective elements are connected to each other by a bump.

7. The integrated circuit according to claim 5, wherein a plurality of the elements are lapped each other, and
    the pads of the wiring structures of respective elements are connected to each other by a pier, the pier configured to pass through the pad.

8. The integrated circuit according to claim 1, wherein the one element and the other element are lapped each other, and
    the pads of the wiring structures of respective elements are connected to each other by a bump.

9. The integrated circuit according to claim 1, wherein a plurality of the elements are lapped each other, and
    the pads of the wiring structures of respective elements are connected to each other by a pier, the pier configured to pass through the pad.

10. A solid image pickup element comprising a busline section having a wiring structure, the busline section being connected to a drive signal output section for outputting a drive signal, the wiring structure comprising:
    a plurality of wirings aligned in parallel on a plane, each wiring comprising:
        a plurality of pads aligned at a substantially constant interval in a left and right direction; and
        a plurality of conductive wires for connecting adjacent pads, the conductive wires having a narrower width than the pads, two conductive wires being extended from one pad in a parallel and opposite direction, one of the two conductive wires having an upper side disposed in a same straight line as an uppermost end of the one pad and the other conductive wire having a lower side disposed in a same straight line as a lowermost end of the one pad, and a gravity center line connecting centers of gravity of all the pads in the wiring and being a straight line not parallel to an extension direction of the conductive wires; and wherein a plurality of the gravity center lines in the plurality of wirings are parallel to each other, and adjacent wirings of the plurality of wirings are spaced more than a minimum wiring spacing.

11. The solid image pickup element according to claim 10, wherein the pad is a quadrangle having an upper side and a lower side, one of the two conductive wires extended from the one pad has a lower side disposed in a same straight line as a lower side of the one pad and the other conductive wire has an upper side disposed in a same straight line as an upper side of the one pad.

12. The solid image pickup element according to claim 11, wherein the solid image pickup element is a back-illuminated type and comprises a drive signal transfer line for inputting the drive signal from the busline section into a pixel column, the drive signal transfer line comprising:

a plurality of busline section drive signal transfer lines traversing the busline section; and a pixel section drive signal transfer line traversing a pixel section in which pixels are aligned, wherein the pixel drive section signal transfer line is wider than the busline section drive signal transfer line, and the plurality of the busline section drive signal transfer lines are connected to the one pixel section drive signal transfer line.

13. The solid image pickup element according to claim 10, further comprising a second wiring structure connected to the wiring structure described in claim 10, wherein the second wiring structure comprises a plurality of wirings aligned in parallel or right angle to the gravity center line connecting centers of gravity of all the pads in the wiring of the wiring structure.

14. The solid image pickup element according to claim 13, wherein the solid image pickup element is a back-illuminated type and comprises a drive signal transfer line for inputting the drive signal from the busline section into a pixel column, the drive signal transfer line comprising:

a plurality of busline section drive signal transfer lines traversing the busline section; and a pixel section drive signal transfer line traversing a pixel section in which pixels are aligned, wherein the pixel drive section signal transfer line is wider than the busline section drive signal transfer line, and the plurality of the busline section drive signal transfer lines are connected to the one pixel section drive signal transfer line.

15. The solid image pickup element according to claim 10, wherein the solid image pickup element is a back-illuminated type and comprises a drive signal transfer line for inputting the drive signal from the busline section into a pixel column, the drive signal transfer line comprising:

a plurality of busline section drive signal transfer lines traversing the busline section; and a pixel section drive signal transfer line traversing a pixel section in which pixels are aligned, wherein the pixel drive section signal transfer line is wider than the busline section drive signal transfer line, and the plurality of the busline section drive signal transfer lines are connected to the one pixel section drive signal transfer line.

16. An imaging device having the solid image pickup element described in claim 10.

* * * * *